(12) United States Patent
Prokin et al.

(10) Patent No.: US 6,646,507 B1
(45) Date of Patent: Nov. 11, 2003

(54) POWER BOOSTER AMPLIFIER

(76) Inventors: Milan Prokin, Dr Agostina Neta 76/64, YU-11070 Novi, Beograd (YU); Milenko Cvetinovic, Save Kovacevica 36A, YU-11000, Beograd (YU)

(*) Notice: Subject to any disclaimer, the term of this patent is extended or adjusted under 35 U.S.C. 154(b) by 0 days.

(21) Appl. No.: 10/130,871
(22) PCT Filed: Oct. 13, 2000
(86) PCT No.: PCT/YU00/00021
§ 371 (c)(1),
(2), (4) Date: May 22, 2002
(87) PCT Pub. No.: WO01/39369
PCT Pub. Date: May 31, 2001

(30) Foreign Application Priority Data

Nov. 23, 1999 (YU) .................................. 602/99

(51) Int. Cl.$^7$ ................................................ H03F 3/217
(52) U.S. Cl. .................................... 330/251; 330/207 A
(58) Field of Search ....................... 330/10, 146, 207 A, 330/251; 363/41

(56) References Cited

U.S. PATENT DOCUMENTS

| | | | |
|---|---|---|---|
| 3,585,517 A | 6/1971 | Herbert | 330/10 |
| 4,186,437 A | 1/1980 | Cuk | 363/65 |
| 4,220,832 A | 9/1980 | Nagel | 179/115.5 |
| 4,360,707 A | 11/1982 | Joseph et al. | 179/1 A |
| 2003/0102915 A1 * | 6/2003 | Wight | 330/207 A |

FOREIGN PATENT DOCUMENTS

DE 37 16826 A1 12/1988

OTHER PUBLICATIONS

"Power Booster Audio Amplifier," Milan Prokin, IEEE Transactions on Consumer Electronics, vol. 48, No. 1, Feb. 2002, pp. 23–33.

* cited by examiner

*Primary Examiner*—Steven J. Mottola
(74) *Attorney, Agent, or Firm*—Wiggin & Dana LLP; Gregory S. Rosenblatt; Michael K. Kinney

(57) ABSTRACT

The main difference between the power booster amplifier according to this invention and state of the art class D amplifiers is in the connection of a load between a power supply and a switching half bridge which is supplied from a bridge capacitor. The switching half bridge operation is controlled by pulse-width modulated control signals. Thereby, it is possible to completely eliminate both input and output filters which are required in state of the art class D amplifiers. It is also possible to achieve several times higher power at the load due to the additional supply from the bridge capacitor for the switching half bridge. The conducted and radiated EMI noise is significantly reduced in comparison with state of the art class D amplifiers. This embodiment provides a low price, small size and low EMI noise level.

9 Claims, 5 Drawing Sheets

POWER BOOSTER AMPLIFIER

TECHNICAL FIELD

This invention generally relates to amplifiers, and more particularly to audio amplifiers and inverters for driving electric motors.

This invention overcomes the problem of amplifying signals having varying frequency in a wide range, theoretically from zero frequency to some predefined frequency, by the use of a small number of electronic components, so to provide: maximum load power, several times higher than the power which can be achieved from the same power supply by the use of the existing amplifiers of all classes without boost converter as a power supply; minimum distortion; maximum efficiency; elimination of radiated and conducted noise; maximum power supply noise rejection; efficient protection from overvoltage emerging from power supply; and minimal size of the amplifier. This technical problem is solved by new power booster amplifier, hereafter PB amplifier, according to the following specification.

BACKGROUND ART

Prior art discloses only amplifiers with a load at their output (FIG. 1), but does not disclose amplifiers with a load at their input (FIGS. 2 and 3) directly connected to the power supply.

Different embodiments of switching class-D amplifiers for a mono-phase load (for instance, a single voice coil loudspeaker) are disclosed in the following U.S. Pat. No. 3,585,517 issued June 1971, to R. B. Herbert (FIG. 5); U.S. Pat. No. 4,649,565 issued March 1987, to A. J. M. Kaizer et al. (FIG. 4); and Pat. No. Re. 33,333 issued Sep. 11, 1990, to W. E. Taylor, Jr. et al.

Class D amplifier for a two-phase load (for instance, a loudspeaker with two grounded voice coils) is disclosed in U.S. Pat. No. 4,360,707, issued November 1982, to J. R. Joseph et al.

Output LC filter of a class D amplifier, used for the reconstruction of the amplified signal at the output of the switching bridge, requires a large number of components of significant size, whereby the price and the dimensions of class D amplifier are considerably increased.

If the amplifier load is other than nominal for output LC filter, the amplitude response will significantly depart from the designed one. In case of a load value less than nominal, the amplitude response will be less than that designed. In case of a load value greater than nominal, the amplitude response will be greater than that designed. In case of a unloaded amplifier operating in the vicinity of parallel resonance frequency of the output LC filter, extremely high voltage is generated, which could lead to a filter capacitors breakthrough.

However, the majority of the loads used nowadays, such as electrodynamic loudspeakers, induction electric motors and brushless DC motors, are characterized by a significant inductance of their windings in relation to resistance, so that they are completely unfit for direct connection to output LC filters which are designed for a purely resistive load. One skilled in the art solves this problem by the use of a Sobel filter connected in parallel to the inductive load, whereby the total impedance becomes purely resistive at all frequencies of interest. Sobel filter consists of a resistor of the same value as the load resistance, serially connected to a specially selected capacitor canceling the effect of the load inductance. However, this solution considerably increases the dissipation of the switching bridge because additional low impedance is connected in parallel to the amplifier output.

Output LC filters of audio amplifiers and fast reacting electric motor drives feature relatively low impedance of filtering inductances, leading to an increase in current ripple through all transistors in the switching bridge, and thereby to increased dissipation on them and resistances of filter inductances.

Input LC filter of a class D amplifier, which is used to reduce injection of conducted EMI noise from the switching bridge into the cable connecting the power supply, requires bulky components, whereby the price and the dimensions of class D amplifiers are increased.

The design of such input LC filter requires special attention due to mutual interaction between its output impedance and the input impedance of the switching bridge, in order to avoid voltage oscillations at the switching bridge.

A special problem appearing during the operation of class D amplifiers with both positive and negative power supplies is the power supply bus "runaway" during the amplification of low frequency signals. During the positive half cycle of an input signal, the observed switch is on most of the time and power is delivered to the load and partly accumulated in the filter inductor. During the negative half cycle, the observed switch is off most of the time, and the current of the filter inductor returns back to the power supply through the diode antiparallel to the observed switch. In that case, during the positive half cycle the positive power supply voltage is decreased, while during the negative half cycle it is increased. Bearing in mind that most of power supplies are made to source, and not to sink the current, the voltage increase requires utilization of bulky capacitors or special protection circuits in the power supply.

A more detailed discussion on the problems associated with state of the art class D amplifiers is given in application notes: AN1042 "High Fidelity Switching Audio Amplifiers Using TMOS Power MOSFETs" issued by Motorola Semiconductor in 1989, AN1013 "Mono Class-D Amplifiers" issued by SGS-Thomson Microelectronics in 1998, AN9525 "Class-D Audio II Evaluation Board" issued by Harris Semiconductor in 1996, "A Real Analysis of the Power Behind Audio Power Amplifier Systems" and SLOA031 "Design Considerations for Class-D Audio Power Amplifier", both issued by Texas Instruments in 1998 and 1999, respectively.

A standard high-power amplifier consists of a switching power supply for voltage increase (boost converter) connected to a Class-D amplifier (FIG. 6).

A special kind of amplifier made of two bidirectional Cuk converters is disclosed in U.S. Pat. No. 4,186,437, issued January 1980 to S. Cuk (FIG. 7).

A switching amplifier for a two-phase load is disclosed in German patent document DE3716826A1, issued December 1988 to K. Michael et al. (FIG. 9).

Linear push-pull amplifiers for a two-phase load (for example, a loudspeaker with two grounded voice coils) are disclosed in the following U.S. Pat. No. 4,130,725, issued December 1978 to M. J. Nagel, U.S. Pat. No. 4,201,886, issued May 1980 to M. J. Nagel, and U.S. Pat. No. 4,220,832, issued September 1980 to M. J. Nagel.

Linear class AB amplifiers for a two-phase load (for example, a loudspeaker with two grounded voice coils) with variable voltage power supply are disclosed in U.S. Pat. No. 5,748,753, issued May 1998 to R. W. Carver.

The basic problem in all existing linear audio amplifiers in classes A, B and AB is the generation of heat and low efficiency during normal operation, requiring high power consumption from the power supply, which is of a specific interest for battery supplied devices such as those in cars, portable computers, radios, cassette and CD players.

DISCLOSURE OF THE INVENTION

The first object of the present invention is to provide a new power booster amplifier in which a two-phase load is directly connected to the power supply, on one side, and the appropriate switching half bridge, on the other side, and the switching half bridge to the bridge capacitor.

The second object of the present invention is to provide the same amplifier as the first, with the addition of an output filter between the two-phase load and the appropriate switching half bridge.

BRIEF DESCRIPTION OF DRAWINGS

The advantages and features of the present invention will be readily apparent to those skilled in the art from the detailed description of the preferred embodiments of the present invention in connection with the accompanying drawings in which.

BEST MODE(S) FOR CARRYING OUT THE INVENTION

Figure 1:
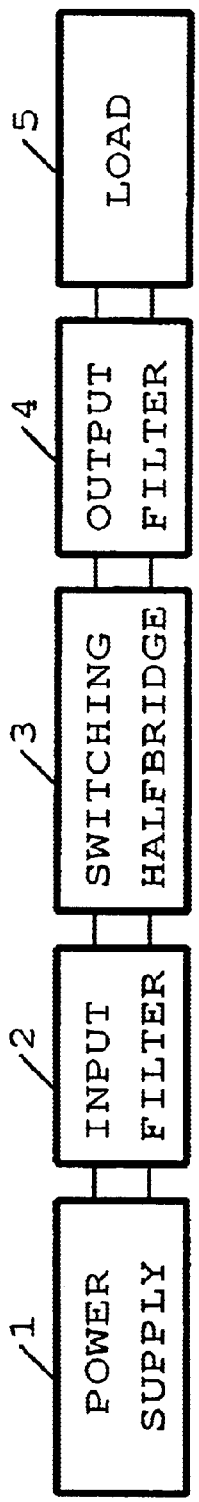
FIG. 1 is a block diagram of state of the art class D amplifier.

FIG. 1 is a block diagram of state of the art class D amplifier. The power supply 1 is connected to the input filter 2 input. The input filter 2 output is connected to the switching half bridge 3 input. The switching half bridge 3 operation is controlled by the pulse-width modulated control signals PWM. The switching half bridge 3 output is connected to the output filter 4 input. The output filter 4 output is connected to the load 5. The consequences of this design are already discussed in the description of the prior art.

Figure 2:
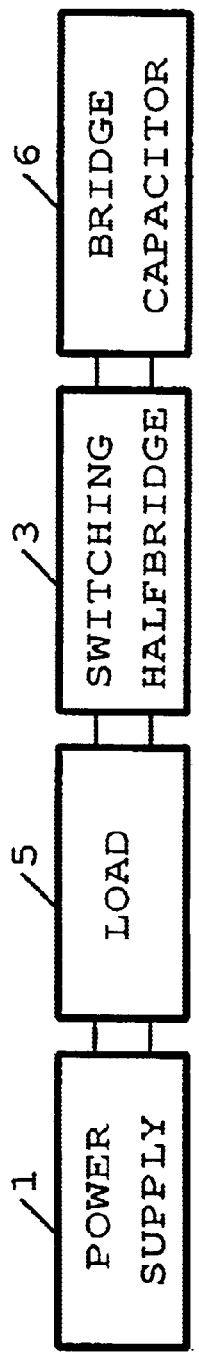
FIG. 2 is a block diagram of the invented power booster amplifier (further PB amplifier) with the bridge capacitor connected to the switching half bridge ends.

FIG. 2 is a block diagram of the invented power booster amplifier (PB amplifier). The power supply 1 is connected to the load 5 input. The load 5 output is connected to the switching half bridge 3 input. The switching half bridge 3 operation is controlled by the pulse-width modulated control signals PWM. The switching half bridge 3 output is connected to the bridge capacitor 6. This embodiment completely eliminates both the input filter and the output filter, while directly connecting the load 5 to the power supply 1, and enables several times greater power at the load 5 with the help of an additional supply at the switching half bridge 3 from the bridge capacitor 6. The conducted and radiated EMI noise is significantly reduced in comparison with class D amplifier. This embodiment makes a low price, small size and low level of EMI noise possible.

Figure 3:
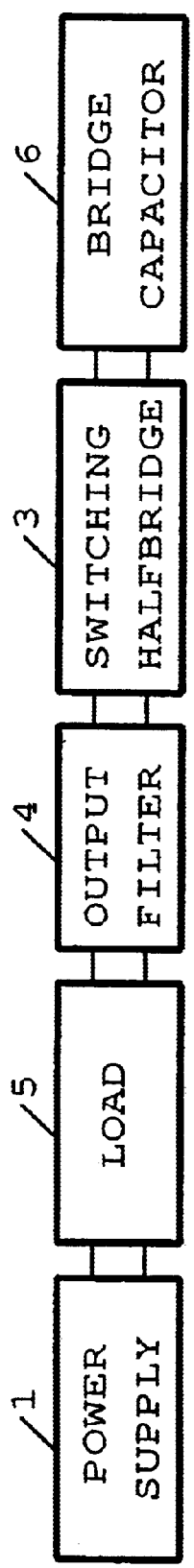
FIG. 3 is a block diagram of the invented PB amplifier with the bridge capacitor connected to the switching half bridge ends and the output filter.

FIG. 3 is a block diagram of the invented PB amplifier with an output filter. The power supply 1 is connected to the load 5 input. The load 5 output is connected to the output filter 4 input. The output filter 4 output is connected to the switching half bridge 3 input. The switching half bridge 3 operation is controlled by the pulse-width modulated control signals PWM. The switching half bridge 3 output is connected to the bridge capacitor 6. This embodiment completely eliminates the input filter 2 and significantly reduces the output filter 4, while directly connecting the load 5 to the power supply 1, and enables several times greater power at the load 5 with the help of an additional supply at the switching half bridge 3 from the bridge capacitor 6. This embodiment is used to further decrease the conducted and radiated EMI noise to a negligible level in comparison with class D amplifier. This embodiment enables an extremely low level of EMI noise, together with slightly higher price and size of the amplifier.

Figure 4:
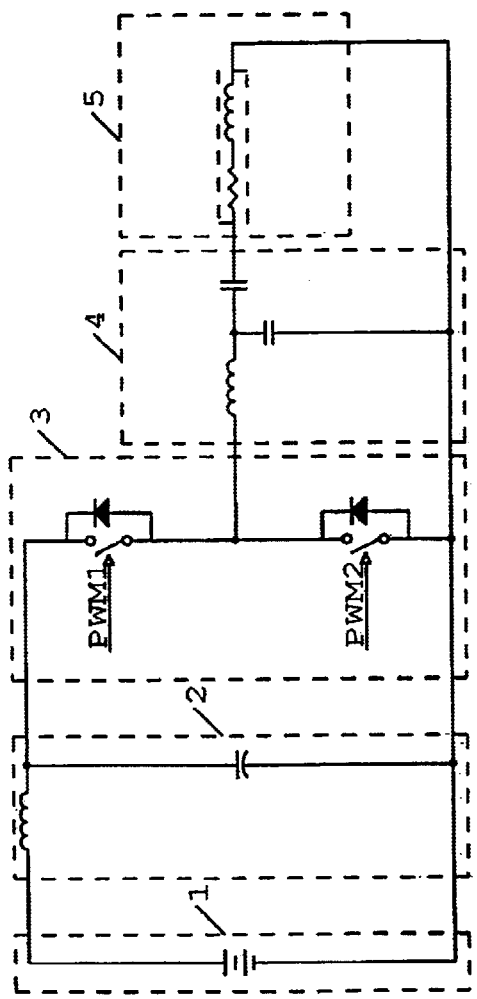
FIG. 4 is a schematic diagram of state of the art class D amplifier with input and output filters and a mono-phase load at its output.
Figure 5:
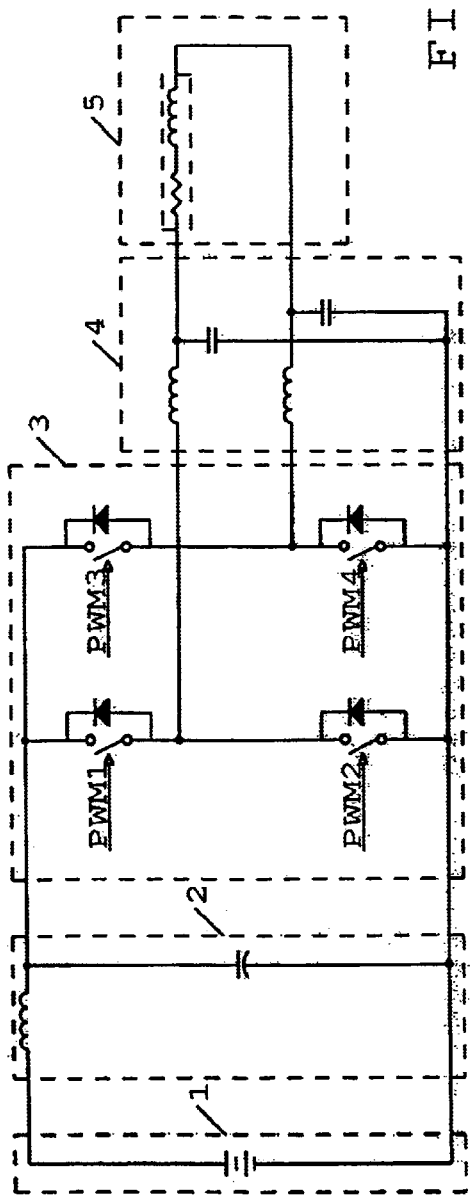
FIG. 5 is a schematic diagram of state of the art class D amplifier with input and output filters and a mono-phase load at its output.
Figure 6:
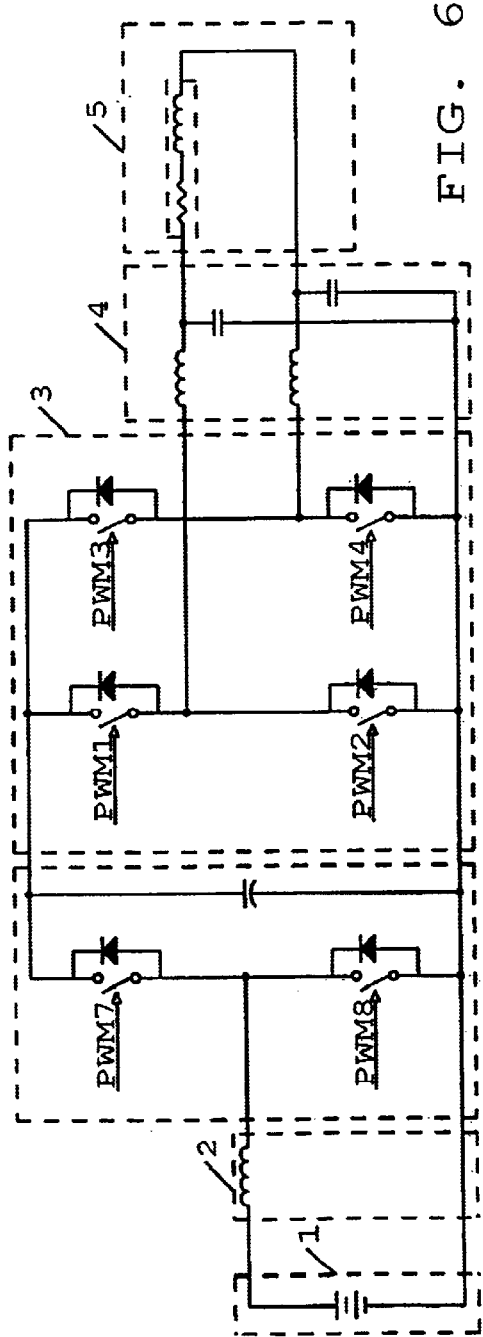
FIG. 6 is a schematic diagram of state of the art boost converter connected to a class D amplifier and a mono-phase load at its output.

FIGS. 4, 5 and 6 are schematic diagrams of state of the art class D amplifiers with input and output filters and mono-phase loads at their output, respectively. The power supply 1 disturbances are filtered in an input filter 2. The switching half bridge 3 draws pulsed current from the input filter 2, generating accordingly a high level of the conducted and radiated EMI noise, especially in case of long cables between the power supply 1 and the input filter 2. The output filter 4, intended for filtering noise and decreasing voltage ripple at the load 5, is connected between the switching half bridge 3 and the load 5. In case of short cables between the switching half bridge 3 and the load 5, in some cases it is possible to eliminate the output filter 4, however significantly increasing the conducted and radiated EMI noise.

Figure 7:
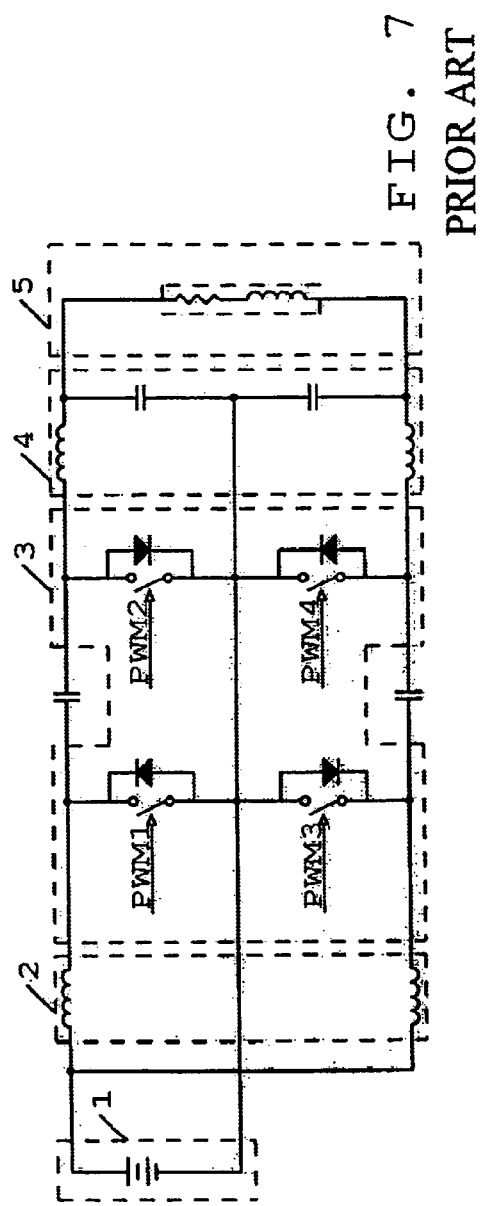
FIG. 7 is a schematic diagram of the Cuk amplifier made of two bidirectional Cuk converters with a mono-phase load at its output.

FIG. 7 is a schematic diagram of the Cuk amplifier made of two bidirectional Cuk converters with a mono-phase load at its output. Detailed analysis shows that transfer function is non-linear, and that it can be approximated as linear only in the vicinity of zero output voltage. This amplifier also requires 4 switches, which is twice as much as the minimum required number of switches for the achievement of symmetrical amplifying function.

Figure 8:
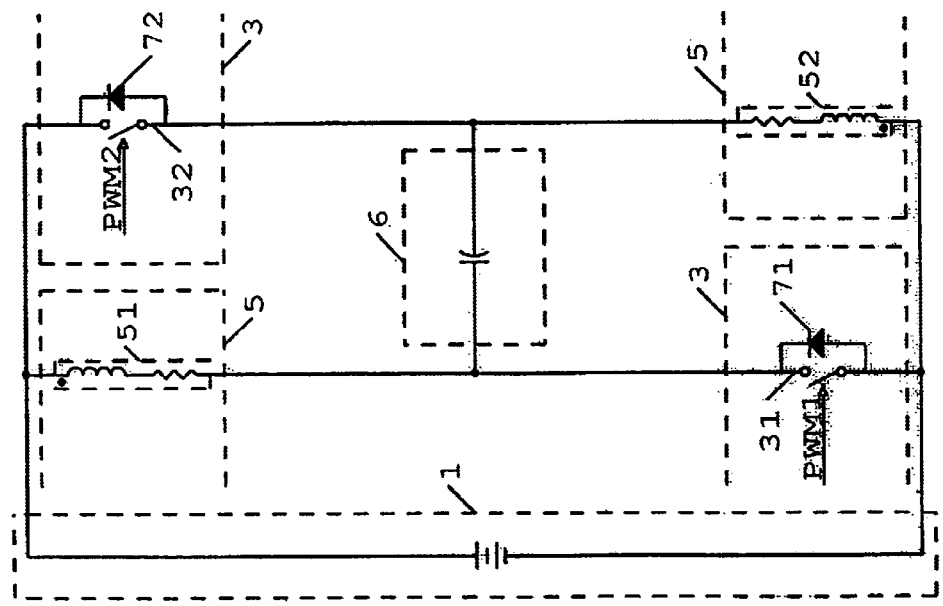
FIG. 8 is a schematic diagram of the invented PB amplifier with the bridge capacitor connected to the switching half bridge ends and a two-phase load, appropriate to the block diagram of FIG. 2.

FIG. 8 is a schematic diagram of the invented PB amplifier with the bridge capacitor 6 connected to the switching half bridge 3 ends and a two-phase load 5, appropriate to the block diagram of FIG. 2. The switching half bridge 3 consists of switches 31 and 32, as well as diodes 71 and 72. The switching half bridge 3 operation is controlled by the pulse-width modulated control signals PWM1 and PWM2, which are typically counter phased, i.e. when PWM1 is active, PWM2 is inactive and vice versa. However, these signals could be controlled in some other manner, thus modifying transfer function of the amplifier. In further description, the simplest case of a counter phase generation of control signals PWM1 and PWM2 is used, which is also most often used in practice, and well known to those skilled in the art.

Signal PWM1 is active and signal PWM2 is inactive during pulse duration within one period of a pulse-width modulation. The signal PWM1 is inactive and signal PWM2 is active during duration of pause within the same period. An average value of PWM1 within one period is appropriate to the modulated signal value, while the average value of PWM2 within the same period is appropriate to the inverted modulated signal value.

The modulator itself can be made by the generator of a reference triangular or a sawtooth voltage and a comparator which compares said reference voltage with an input voltage which should be modulated. The modulator can also be made by a counter in which digital words, appropriate to the binary value of input voltage samples, are written. All those modulator realizations are well known to those skilled in the art.

For active signal PWM1, the switch 31 is on and the switch 32 is off, so the first current loop covers the power supply 1, the first phase 51 of the load 5, the switch 31, while the second current loop covers the bridge capacitor 6, the second phase 52 of the load 5 and the same switch 31. At relatively low levels of continuous power in comparison with maximum continuous (rms) power, the voltage at the bridge capacitor 6 is close to the voltage of the power supply 1. Therefore, the voltage at the capacitor node of off switch 32 is close to the negative value of the power supply 1 voltage.

For active signal PWM2, the switch 32 is on and the switch 31 is off, so the third current loop covers the power supply 1, the second phase 52 of the load 5 and the switch 32, while the fourth current loop covers the bridge capacitor 6, the first phase 51 of the load 5 and the same switch 32. At relatively low levels of continuous power in comparison with maximum continuous (rms) power, the voltage at the bridge capacitor 6 is close to the voltage of the power supply 1. Therefore, the voltage at the capacitor node of off switch 31 is close to the double value of the power supply 1 voltage.

In that manner, the bridge capacitor 6 serves as an additional power supply battery for the load 5, enabling almost the full value of the power supply voltage at each of phases 51 and 52 of the load 5.

Diodes 71 and 72 are connected in antiparallel to switches 31 and 32, respectively, and pass the current when all switches are off. The role of switches can be fulfilled by any semiconductor switches, such as bipolar transistors, mosfets or IGBT, depending on required frequency of control signals, current, voltage and dissipation of switches. If MOSFET transistors are used as switches, said diodes 71 and 72 stand for internal parasitic diodes of MOSFET transistors, which is well known to those skilled in the art.

For zero average value of the modulated signal (for example a sinewave signal), the average values of control signals PWM1 and PWM2 are identical, so the average values, i.e. DC components of the currents through both phases 51 and 52 of the load 5 are identical, and serve to charge the bridge capacitor 6.

In most loads of dual voice coil loudspeaker type, inductances of both phases 51 and 52 of the load 5 are coupled. If the inductances of both phases 51 and 52 of the load 5 are coupled, the average current values through both phases 51 and 52 are directed from the power supply 1 to the bridge capacitor 6, so their fluxes will cancel each other according to the reference markers shown. Thus, the average value of summary flux is equal to zero, so the magnetic material of the load 5 is utilized as in a standard class-D amplifier. The average force value generated by the mentioned average currents is also cancelled to zero.

However, modulated current components through the first phase 51 and the second phase 52 of the load 5 have opposite directions regarding the power supply 1, so their fluxes will add to one another according to the reference markers shown. Thus, the modulated force values, produced by mentioned modulated currents, are also added.

A special quality of the presented solution is practical insensitivity to variations of the power supply 1 voltage, which produce identical currents in symmetrical inductances of both phases 51 and 52 of the load 5, so their fluxes and forces cancel each other.

Another special quality of the presented solution is practical insensitivity to variations of the bridge capacitor 6 voltage, which produce identical currents in symmetrical inductances of both phases 51 and 52 of the load 5, so their fluxes and forces cancel each other.

Figure 9:
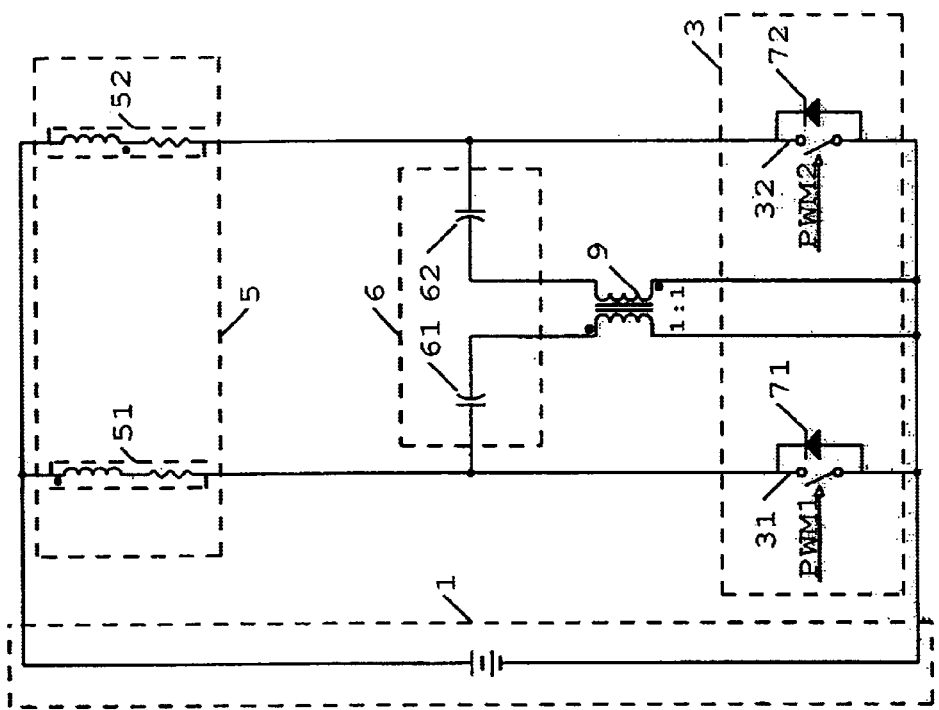
FIG. 9 is a schematic diagram of the state-of-the-art switching amplifier with the bridge capacitor and a coupling transformer connected to the switching half bridge ends and a two-phase load.

FIG 9 presents the state-of-the-art switching amplifier schematic employing bridge capacitor 61 and 62 and a coupling transformer 9 connected to the switching half bridge 3 ends and a two-phase load 5. Both switches 31 and 32 are connected to the negative node of the power supply 1. At relatively low levels of continuous power in comparison with maximum continuous (rms) power, the voltage at each of bridge capacitors 61 and 62 is close to the voltage of the power supply 1, while voltages at the primary and the secondary of the coupling transformer 9 are also close the positive and the negative value of the power supply 1 voltage, respectively. However, this amplifier is much more complex in comparison with PB amplifier from FIG. 8, due to the addition of a transformer with almost unity transfer ratio and two capacitors instead of one.

Figure 10:
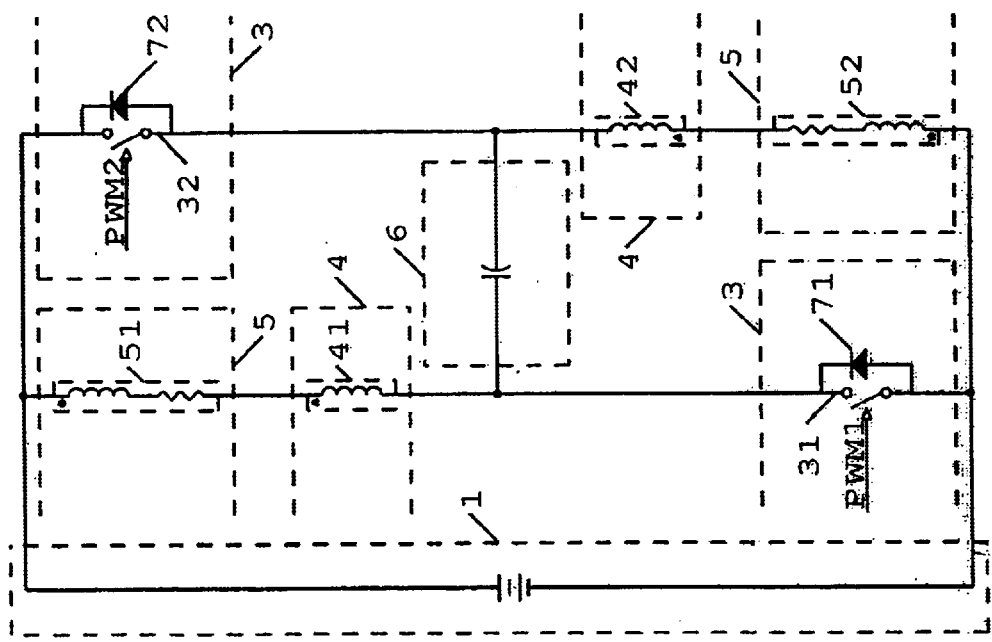
FIG. 10 is a schematic diagram of the invented PB amplifier with the bridge capacitor connected to the switching half bridge ends, output L filter and a two-phase load, appropriate to the block diagram of FIG. 3.

FIG. 10 is a schematic diagram of the invented PB amplifier with the bridge capacitor 6 connected to the switching half bridge 3 ends, output L filter 4 and a two-phase load 5, appropriate to the block diagram of FIG. 3. The output L filter 4 is connected between each phase of the load 5 and the appropriate input of the switching half bridge 3 and serves for the additional filtering of the current through the load 5. The output L filter 4 consists of two filtering inductors 41 and 42 which can be coupled. The first reason for the application of the output L filter 4 is a relatively small inductance of the load 5, thus recommending the utilization of toroidal inductance in order to decrease the radiated noise. The second reason for the output L filter 4 application is the additional attenuation of disturbances from the switching half bridge 3, thus recommending utilization of ferrite beads.

Figure 11:
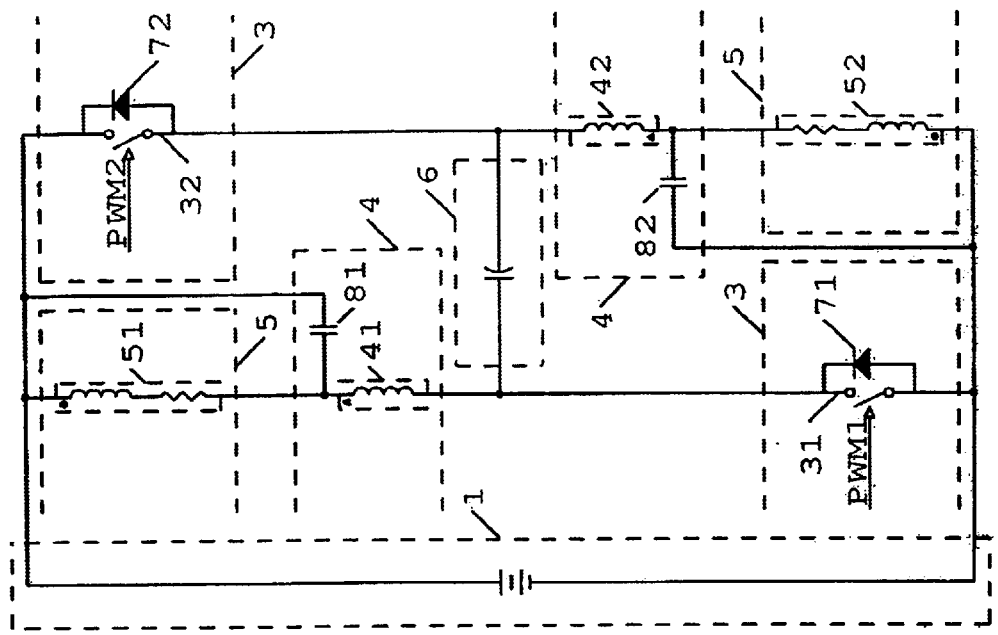
FIG. 11 is a schematic diagram of the invented PB amplifier with the bridge capacitor connected to the switching half bridge ends, output LC filter and a two-phase load, appropriate to the block diagram of FIG. 3.

FIG. 11 is schematic diagram of the invented PB amplifier with a bridge capacitor 6 connected to the switching half bridge 3 ends, output LC filter 4 and a two-phase load 5, appropriate to the block diagram of FIG. 3. The output LC filter 4 is connected between each phase of the load 5 and the appropriate input of the switching half bridge 3 and serves for the additional filtering of the current through the load 5. The output LC filter 4 consists of two filtering inductors 41 and 42 which can be coupled, and two filtering capacitors 81 and 82. The first reason for the application of the output L filter 4 is a relatively small inductance of the load 5, thus recommending utilization of the toroidal inductance in order to decrease the radiated noise. The second reason for the output L filter 4 application is the additional attenuation of disturbances from the switching half bridge 3, thus recommending utilization of ferrite beads.

The switch 31 with diode 71 from FIG. 8 can be made using NMOS transistor, and the switch 32 with diode 72 can be made using PMOS transistor, wherein the control signal PWM1 is referenced to the negative node of the power supply 1, while the control signal PWM2 is referenced to the positive node of the power supply 1.

In case when two NMOS transistors are required, the control signal PWM2 must be referenced to the negative node of the bridge capacitor 6, and supply for the gate driver of NMOS transistor realizing switch 32 with diode 72 must be floating ("bootstrap") or galvanically isolated, which is well known to those skilled in the art.

Industrial Applicability

The maximum voltage at the bridge capacitor 6 is limited inherently to the value of the power supply 1 voltage without using any feedback, in distinction with boost converters where this voltage is unlimited, which, without feedback, could lead to switches breakthrough. At full load, this voltage at the bridge capacitor 6 falls down to ⅓ of the power supply 1 voltage, which limits the maximum continuous (rms) power to about 2 times greater than rms power of state of the art class D amplifiers, at the same power supply voltage and the same load 5 impedance.

The crest factor as a ratio of maximum peak power to rms power expressed in dB, is a very important parameter in the field of audio power amplifiers. The crest factor for a sine wave signal is only 3.01 dB, i.e. the peak power is only 2 times higher than the rms power. The analysis of various musical genres, from classical, pop, rock to jazz, shows a variation in the crest factor from a minimum of 11 dB for pop and rock to a maximum of 21 dB for some classical or jazz music, which corresponds to a ratio of peak power to rms power from a minimum of 11.6 to a maximum of 126. In audio application it could be assumed that the average crest factor is about 15 dB, i.e. 31.6 times for the majority of the musical content.

Consequently, in case of music signal amplification, the rms power is relatively small, so the bridge capacitor 6 voltage reaches almost the power supply voltage. From there, a peak power of two-phase PB amplifier for a music signal is more than 4 times greater than the peak power of state of the art class D amplifiers with the same power supply voltage and the same load 5 impedance. The power consumption of PB amplifiers, as well as state of the art class D amplifiers, in case of a music signal amplification, is 2.5 times less than for the best state of the art linear amplifiers in classes B and AB, in conditions of the same output power.

For instance, in automotive electronics with power supply voltage of 14.4V, the loudspeaker impedance of 4 Ohms and distortion of 1%, class AB amplifiers achieve only 19W rms and 38W peak power, class D amplifiers achieve 21W rms and 42W peak power, while the PB amplifier using serially connected 2+2 Ohms loudspeaker achieves 42W rms and 193W peak power.

For instance, in automotive electronics with power supply voltage of 14.4V, the loudspeaker impedance of 4 Ohms and distortion of 10%, class AB amplifiers achieve 25W rms and 40W peak power, class D amplifiers achieve 27W rms and 45W peak power, while the PB amplifier using serially connected 2+2 Ohms loudspeaker achieves 50W rms and 230W peak power.

It follows that PB amplifier is exceptionally adapted to amplify music signals in vehicles, showing all its advantages. Moreover, standard dual voice coil loudspeakers are made for higher power, so the application of PB amplifier does not require any change in the existing technology of loudspeaker manufacturing.

Similar situation is valid for the PB amplifier application in the field of electric motor drives. Namely, in order to provide a better transient response, particularly during the acceleration of an electric motor, a significant power reserve is required, which is successfully provided by the bridge capacitor 6. During normal operation, the necessary power of most electric motor drives is much less, which is appropriate to the crest factor of at least 6 dB, i.e. 4 times.

Standard amplifiers of all classes during a too large sinewave signal at input limit the output signal by cutting off sinewave peaks, thus leading to a very high distortion. In distinction to them, the PB amplifier with the help of coupled inductances in the load 5 features much less distortion. Namely, in case of a too large input signal, currents through inductances become distorted in the same way, that their difference is very little distorted. Since the current difference is proportional to the force, for example, for moving a loudspeaker cone, or rotating the rotor of an electric motor, thus the distortion of either sound or angular velocity of a shaft of an electric motor is very small.

The PB amplifier limits current circuit with pulse currents to the small area contour connecting the switching half bridge 3 and the bridge capacitor 6, thus drastically decreasing the radiated emission. Using standard input LC filter it is possible to decrease the conducted and radiated EMI noise emanating from the cable connecting the power supply 1 and the load 5.

As modern personal computers are using lower power supply voltages for supplying microprocessors and memories, the 12V voltage is utilized practically only for hard disk supply and audio amplifiers. Using the PB audio amplifiers it is possible to decrease the need for the 12V power supply voltage.

A special feature of the PB amplifier is a multiple utilization of the load 5 impedance, unexploited in an engineering practice since:

1. The load 5 is decreasing amplifier distortion due to coupled inductances, thus providing the use of the most standard and the most economical feedback. Measurements show that the acoustic performance of the PB amplifier with dual voice coil loudspeaker is identical or even slightly better than the acoustic performance of the reference laboratory class A amplifier using the same loudspeaker with serially connected voice coils, in order to achieve the same impedance.

2. The load 5 serves as an input filter, eliminating the influence of power supply 1 noise to its own summary current. For the ideally symmetrical coils of the load 5, the theoretical power supply rejection factor is infinite. In this manner, the PB amplifier feedback shows only a secondary role. This solves one of the basic problems of state of the art class D amplifiers whose feedback provides a typical power supply rejection factor at high audio frequencies of only 40 dB. A special complicated feedback could increase this factor up to 60 dB, which is appropriate to state of the art linear amplifiers in classes A, B and AB. This feature is very important in automotive electronics where the power supply noise is even for the order of magnitude greater than the power supply voltage itself.

3. The load 5 serves as an output filter, eliminating the influence of the switching half bridge 3 noise to its own summary current. This avoids the above mentioned problem of the load 5 impedance influence to an amplitude response of a class D amplifier using the output LC filter, drastically reducing the price and the size of the amplifier, as well as distortions due to the excursions of the output LC filter inductance into saturation during high signal magnitudes. The amplifier efficiency is also increased by decreasing current ripple through the switches, with the help of a relatively high own inductance of the load 5, in relation to state of the art solution with small filter inductances in the output LC filter, especially in relation to the solution with the Sobel filter. The PB amplifier besides its own inductance of the load 5, successfully utilizes even the parasitic distributed capacitance between the coils of the load 5 as a filtering element.

4. The load 5 limits the initial charging current of the bridge capacitor 6 during power on and power supply voltage transients, with the help of its own resistance, even when all switches in the switching half bridge 3 are off, in distinction to the existing boost converters where this current is limited only by small parasitic resistance of an input inductor.

The summary characteristics of the PB amplifier in relation to state of the art solutions using the example of a two-phase PB amplifier during the reproduction of music-like signals are:

increase in maximum continuous (rms) power by a factor of 2 for the same load 5 summary impedance and power supply 1 voltage;

increase in maximum peak power by a factor of 4 for the same load 5 summary impedance and power supply 1 voltage;

decrease in distortion at the same rms and peak power;

it contains only 2 pulse-width modulated switches in the switching half bridge 3;

complete elimination or significant reduction in size and price of the input filter 2;

complete elimination or significant reduction in size and price of the output filter 4;

significant reduction in weight of the amplifier as a consequence of reduction of number of components;

significant reduction in size of the amplifier as a consequence of reduction of number of components;

considerable reduction of conducted EMI noise along the power supply cable between the load 5 and the power supply 1;

considerable reduction of the radiated EMI noise;

increased efficiency of the amplifier due to the elimination of the resistance of the input filter 2, output filter 4 and the reduction of current ripple through PWM switches in the switching half bridge 3;

reduction of generated heat and amplifier temperature;

considerable decrease of consumption from the power supply 1 for 2.5 times in relation to linear amplifiers in classes B and AB;

increase in power supply rejection factor;

decrease of initial charging current for the bridge capacitor 6 and its life extension;

considerable decrease in the price of the entire amplifier (for about 2 times) in relation to class D amplifiers having only one half of rms power and only one fourth of the peak power, due to the elimination of filter elements;

drastic decrease in the price of the entire amplifier (for about 10 times) in relation to the additional linear class A, B and AB amplifiers with a boost converter as a power supply, having the same rms power and only one half of the peak power, resulting from the elimination of power supply and heatsink, and the use of smaller power transistors; and possibility to increase the output power up to 8 times by the use of loudspeakers having the impedance of 0.5 Ohms in relation to the impedance of 4 Ohms.

Although the preferred embodiments of the present invention are described and illustrated, those skilled in the art can perform various modifications and design equivalents of this invention. For instance, the role of semiconductor switches can be performed using any known active semiconductor components, such as mosfets, IGBT, bipolar transistors, MCT, etc.

It is also possible to further supplement the embodiments of this invention by an input filter 2 between the power supply 1 and the load 5. Said input filter 2 is typically made on the basis of FIGS. 4 and 5 according to the state of the art, although much more complex realizations are possible. In some cases, said input filter 2 can be treated as a part of the power supply 1, such as LC filter of switching and LC or C filter of linear power supplies.

Such variations and equivalents should not be regarded as a departure from the spirit and the scope of the present invention. Thus, the present invention is intended to cover all such alternatives and modifications obvious to those skilled in the art, within the scope of the following claims.

We claim:

1. A power booster amplifier for driving a two-phase load (51, 52), the amplifier comprising:

first and second power supply terminals for receiving a supply voltage;

first to fourth output terminals for providing output signals to first and second phases of said two-phase load;

first (31) and second (32) switches, each switch having first and second main terminals, and each switch being controllable by a control signal (PWM1, PWM2);

a bridge capacitor (6); wherein said first main terminal of said first switch is connected to said second power supply terminal, said second main terminal of said first switch is connected to said first output terminal, said second output terminal is connected to said first power supply terminal, said first main terminal of said second switch is connected to said first power supply terminal, said second main terminal of said second switch is connected to said third output terminal, said fourth output terminal is connected to said second power supply terminal, said bridge capacitor is connected between said first and third output terminals, an output from the amplifier to said first phase of said two-phase load is provided across said first and second output terminals, and an output from the amplifier to said second phase of said two-phase load is provided across said third and fourth output terminals.

2. The power booster amplifier of claim 1, wherein said two-phase load is comprised of a dual voice coil loudspeaker.

3. The power booster amplifier of claim 1, wherein said first and second switches are semiconductor switches such as one of MOSFETs, IGBTs and bipolar transistors.

4. A power booster amplifier for driving a two-phase load (51, 52), the amplifier comprising:
   first and second power supply terminals for receiving a supply voltage;
   first to fourth output terminals for providing output signals to first and second phases of said two-phase load;
   first (31) and second (32) switches, each switch having first and second main terminals, and each switch being controllable by a control signal (PWM1, PWM2);
   a bridge capacitor (6);
   first (41) and second (42) inductors, each inductor having first and second terminals; wherein
      said first main terminal of said first switch is connected to said second power supply terminal,
      said second main terminal of said first switch is connected to said first terminal of said first inductor,
      second terminal of said first inductor is connected to said first output terminal,
      said second output terminal is connected to said first power supply terminal,
      said first main terminal of said second switch is connected to said first power supply terminal,
      said second main terminal of said second switch is connected to said first terminal of said second inductor,
      said second terminal of said second inductor is connected to said third output terminal,
      said fourth output terminal is connected to said second power supply terminal,
      said bridge capacitor is connected between said second main terminal of said first switch and said second main terminal of said second switch,
      an output from the amplifier to said first phase of said two-phase load is provided across said first and second output terminals, and
      an output from the amplifier to said second phase of said two-phase load is provided across said third and fourth output terminals.

5. The power booster amplifier of claim 4, wherein said two-phase load is comprised of a dual voice coil loudspeaker.

6. The power booster amplifier of claim 4, wherein said first and second switches are semiconductor switches such as one of MOSFETs, IGBTs and bipolar transistors.

7. The power booster amplifier of claim 4, further comprising:
   first (81) and second (82) filtering capacitors, each filtering capacitor having first and second terminals; wherein
      said first terminal of said first filtering capacitor is connected to said first output terminal,
      said second terminal of said first filtering capacitor is connected to said second output terminal,
      said first terminal of said second filtering capacitor is connected to said third output terminal, and
      said second terminal of said second filtering capacitor is connected to said fourth output terminal.

8. The power booster amplifier of claim 7, wherein said two-phase load is comprised of a dual voice coil loudspeaker.

9. The power booster amplifier of claim 7, wherein said first and second switches are semiconductor switches such as one of MOSFETs, IGBTs and bipolar transistors.

* * * * *